United States Patent [19]

Fong

[11] Patent Number: 5,543,668
[45] Date of Patent: Aug. 6, 1996

[54] CHARGE STACKING ON-CHIP HIGH-VOLTAGE GENERATOR AND METHOD

[75] Inventor: Steven K. Fong, San Jose, Calif.

[73] Assignee: Catalyst Semiconductor, Inc., Santa Clara County, Calif.

[21] Appl. No.: 307,998

[22] Filed: Sep. 16, 1994

[51] Int. Cl.⁶ .................................................. H02M 3/18
[52] U.S. Cl. ............................ 307/110; 307/109; 363/56; 363/60
[58] Field of Search ...................................... 307/110, 109; 363/59, 60

[56] References Cited

U.S. PATENT DOCUMENTS

| | | | |
|---|---|---|---|
| 4,199,806 | 4/1980 | Patterson | 363/59 |
| 4,223,238 | 9/1980 | Parkinson | 307/297 |
| 4,673,829 | 6/1987 | Gupta . | |

OTHER PUBLICATIONS

John F. Dickson, "On–Chip High–Voltage Generation in MNOS Integrated Circuits Using an Improved Voltage Multiplier Technique," IEEE Journal of Solid–State Circuits, vol. SC–11, No. 3, Jun., 1976, pp. 374–378.

Witters, et al., "Analysis and Modeling of On–Chip High–Voltage Generator Circuits for Use in EEPROM Circuits," IEEE Journal of Solid-tate Circuits, vol. 24, No. 5, Oct., 1989, pp. 1372–1380.

Primary Examiner—William M. Shoop, Jr.
Assistant Examiner—Albert Paladini
Attorney, Agent, or Firm—Skjerven, Morrill, MacPherson Franklin & Friel; David W. Heid; F. Eric Hoffman

[57] ABSTRACT

A charge stacking, high voltage generating circuit is provided wherein a plurality of capacitors are charged in parallel and discharged in series through a single diode to an output terminal. A switching circuit is used to connect each of the capacitors in parallel between a first supply voltage and a second supply voltage during a first half clock cycle. This configuration allows the capacitors to charge during this first half clock cycle. During a second half clock cycle, the switching circuit connects the charged capacitors in series between the first supply voltage and the output terminal through a single diode. The series configuration of the capacitors is such that the voltage at the output terminal is approximately equal to the first supply voltage, plus the sum of the voltages of the charged capacitors, minus the threshold voltage drop across the series diode.

20 Claims, 6 Drawing Sheets

CHARGE STACKING ON-CHIP HIGH-VOLTAGE GENERATOR AND METHOD

BACKGROUND OF THE INVENTION

1. Field of the Invention

The present invention relates to a method and structure for generating a voltage on an integrated circuit chip. More specifically, the present invention relates to a voltage supply created by charging and discharging capacitors formed on an integrated circuit chip.

2. Description of the Prior Art

Figure 1:
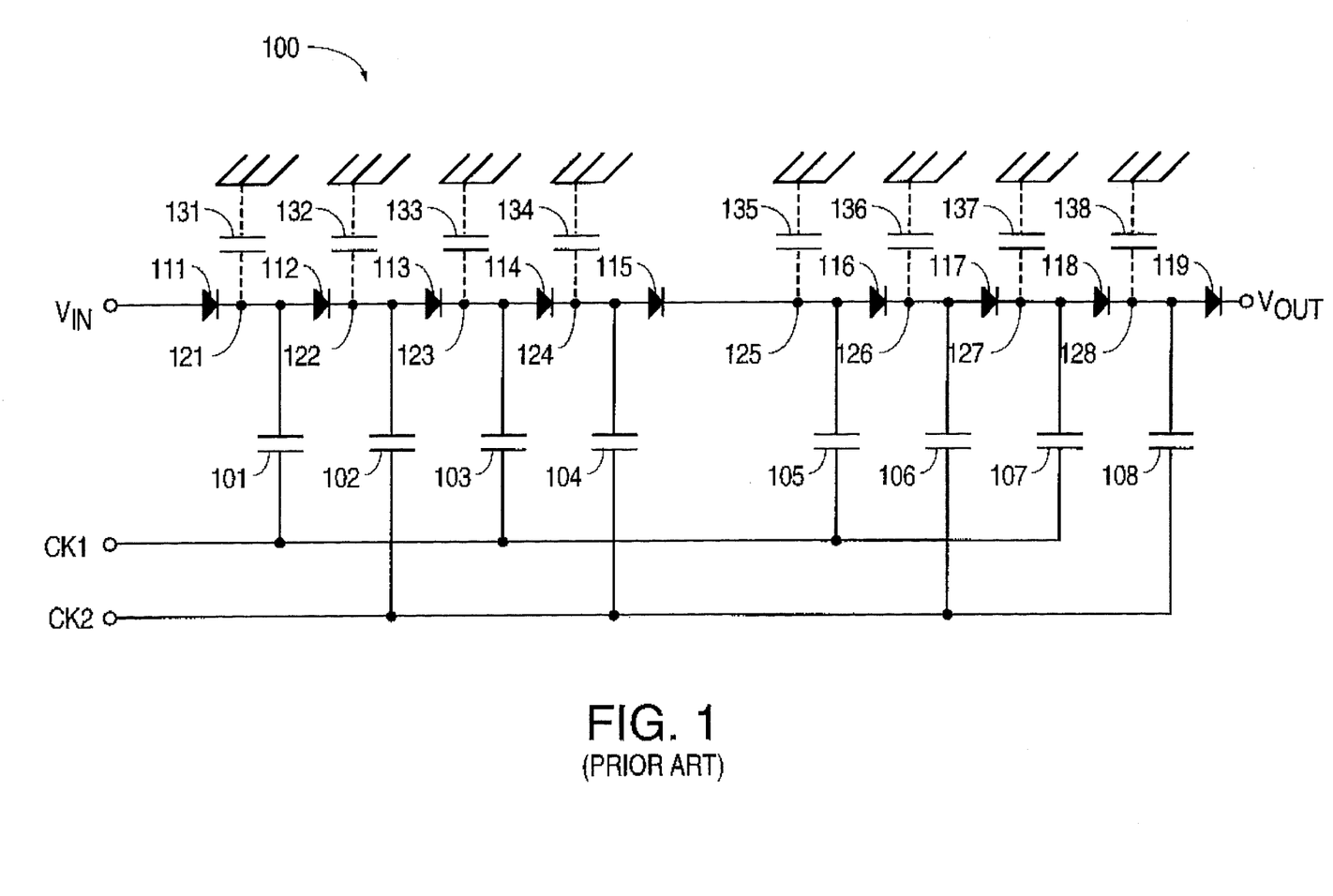
FIG. 1 is a circuit diagram illustrating a prior art charge pump.

FIG. 1 is a circuit diagram of a prior art charge pump 100 used to generate a voltage on an integrated circuit chip. Charge pump 100, which is commonly known as a voltage multiplier circuit, is described in the article by J. Dickson, entitled "On-Chip High-Voltage Generation in MNOS Integrated Circuits Using an Improved Voltage Multiplier Technique", IEEE J. Solid State Electronics, Vol. SC-11, June 1976, pp. 374–378. Charge pump 100 makes use of capacitors 101–108 which are interconnected by diodes 111–119. Capacitors 101, 103, 105 and 107 are coupled in parallel to clock signal Ck1, and capacitors 102, 104, 106 and 108 are coupled in parallel to clock signal Ck2. Clock signals Ck1 and Ck2 are 180 degrees out of phase with each other. Each node 121–128 exhibits stray capacitance, designated by capacitors 131–138.

An input voltage $V_{IN}$ is provided to diode 111 and an output voltage $V_{OUT}$ is generated at the output terminal of diode 119. Diodes 111–119 can be either conventional diodes or diodes fashioned from an MOS transistor (See, the article by J. Witters, G. Groeseneken, H. Maes, entitled "Analysis and Modeling of On-Chip High-voltage Generator Circuits for Use in EEPROM Circuits" IEEE Journal of Solid-State Circuits, Vol. 24, No. 5, October 1989).

Charge pump 100 operates by pumping charge along diodes 111–119 as the capacitors 101–108 are successively charged and discharged during each half clock cycle. The voltages at nodes 121–128 are not reset after each pumping cycle. Consequently, the average potential of nodes 121–128 progressively increases from node 121 to node 128.

Charge pump 100 has several disadvantages. First, each of diodes 111–119 experiences a series voltage drop. The sum of these voltage drops limits the voltage generated at the output terminal of diode 119. In addition, it takes many clock cycles to charge capacitors 101–108 to provide the desired output voltage level. This latency exists because charge pump 100 sequentially charges one capacitor at a time, beginning with capacitor 101 and ending with capacitor 108. The output terminal of diode 119 does not reach the desired voltage until capacitor 108 is charged.

Furthermore, each of capacitors 101–108 must maintain a high voltage in order to supply the desired voltage. Capacitor 108 experiences the highest voltage, which is equal to the voltage at the output terminal of diode 118. The high voltages applied to capacitors 101–108 cause stress on the gate oxides of the capacitors and can cause gate oxide breakdown.

Accordingly, it is desired to have a voltage generating circuit which is capable of quickly generating a desired output voltage. It is also desired to have a voltage generating circuit which does not require the application of a high voltage across the charged capacitors. It is also desired to have a voltage generating circuit which generates the same voltage as prior art voltage generating circuits using less capacitance.

SUMMARY OF THE INVENTION

In accordance with the present invention, a charge stacking, high voltage generating circuit is provided wherein a plurality of capacitors are charged in parallel during a first half of a clock cycle and discharged in series to an output terminal during a second half of a clock cycle. A switching circuit is used to connect each of the capacitors in parallel between a first supply voltage and a second supply voltage during a first half clock cycle. This configuration allows the capacitors to charge during this first half clock cycle. During a second half clock cycle, the switching circuit connects the charged capacitors in series between the first supply voltage and the output terminal.

In one embodiment, a diode is connected between the last capacitor in the string of capacitors and the output terminal. The series configuration of the capacitors is such that the voltage at the output terminal is approximately equal to the first supply voltage, plus the sum of the voltages of the charged capacitors, minus the threshold voltage drop across the series diode.

Because the capacitors are fully charged during the first half of clock cycle, they are able to provide full voltage output during the second half clock cycle. Additionally, because each capacitor is charged in parallel, the voltage across any individual capacitor does not exceed the difference between first supply voltage and the second supply voltage, thereby preventing high voltage stress which can lead to gate oxide breakdown. Any number of capacitors can be used in the present invention, however, only one diode is required. This eliminates the problem associated with voltage drop across multiple diodes in the prior art.

In addition, no complimentary clock signal is required in a voltage generator circuit in accordance with the present invention.

The present invention will be more fully understood in light of the following detailed description taken together with the drawings.

BRIEF DESCRIPTION OF THE DRAWINGS

FIG. 2, which consists of FIGS. 2A and 2B, is a circuit diagram illustrating a charge stacking high voltage generator in accordance with one embodiment of the present invention;

FIG. 4, which consists of FIGS. 4A and 4B, is a schematic diagram of an alternate embodiment of a voltage generator in accordance with the present invention.

DETAILED DESCRIPTION OF THE INVENTION

Figures 2, 2A:
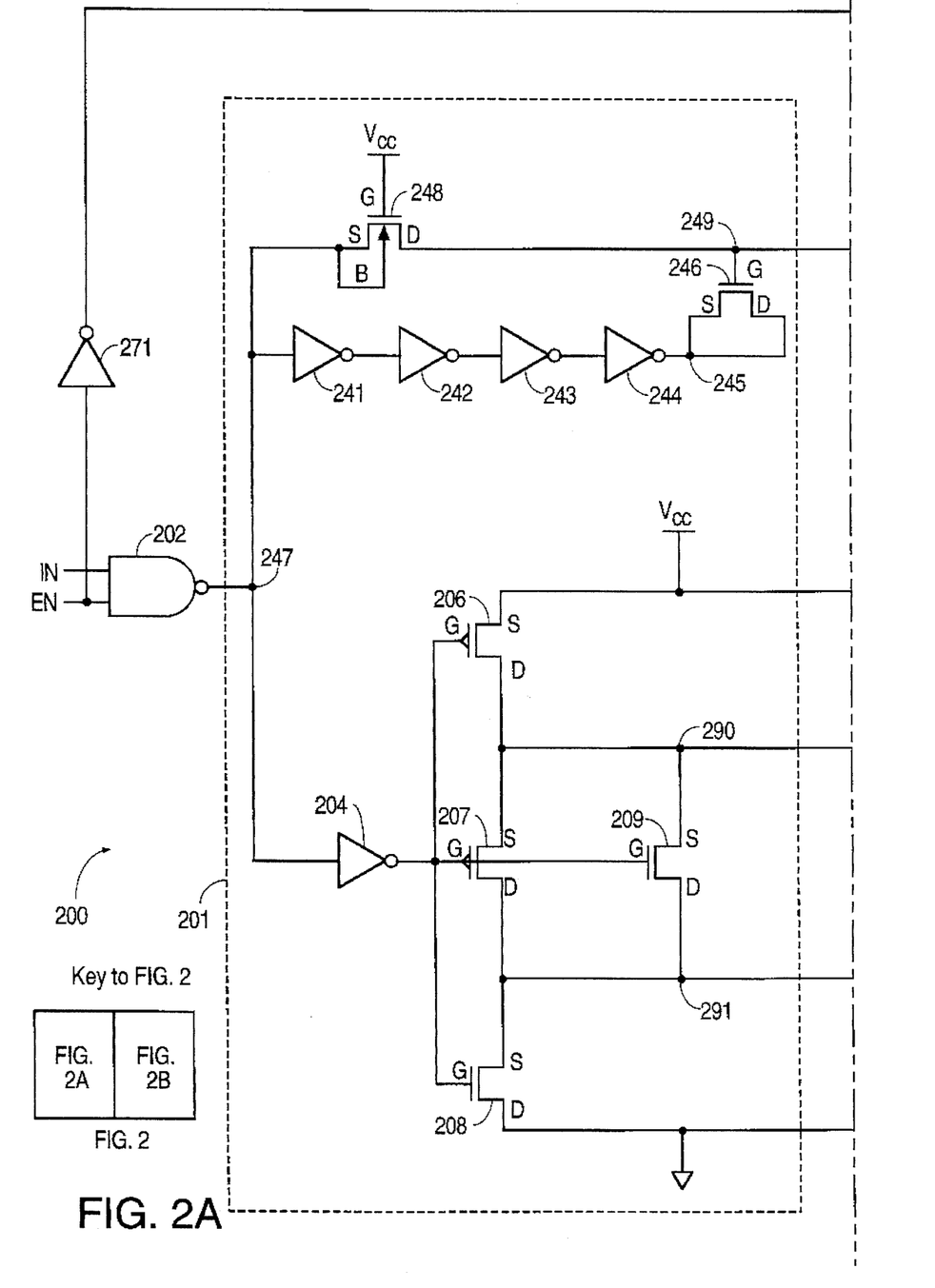
Figure 2B:
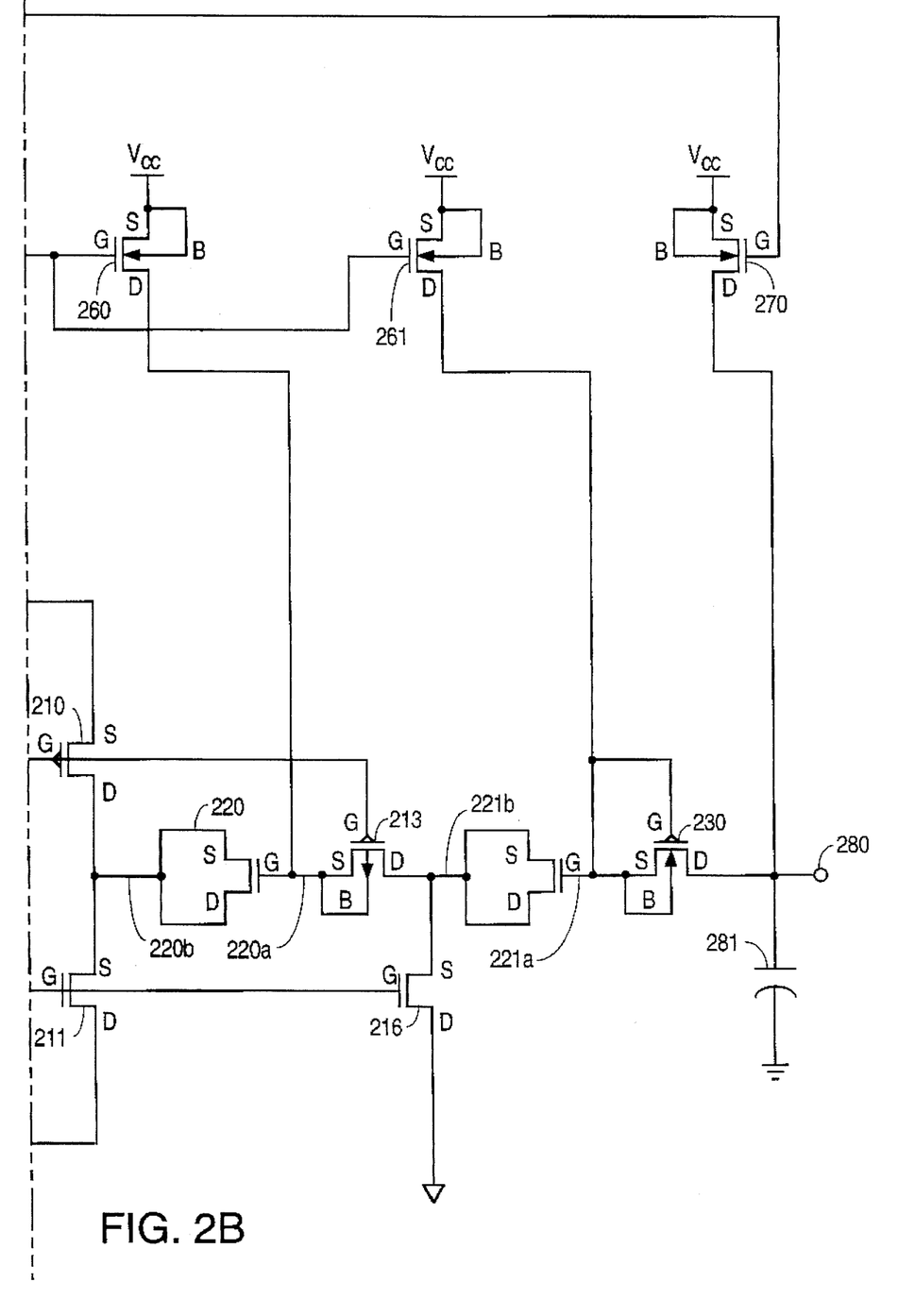

FIG. 2, which consists of FIGS. 2A and 2B as illustrated, is a circuit diagram of charge stacking high voltage generator 200 in accordance with one embodiment of the present invention. The embodiment illustrated in FIG. 2 is shown using elements fabricated using a triple-well CMOS process. An input signal (IN) and an enable signal (EN) are provided to the two input terminals of NAND gate 202. The output signal of NAND gate 202 is provided to switching control circuit 201. Switching control circuit 201 includes inverters 204 and 241–244, p-channel transistors 206–207, n-channel transistors 208, 209, 246 and 248.

Within switching control circuit 201, the output signal of NAND gate 202 is provided to the source and substrate of n-channel transistor 248. The gate of transistor 248 is connected to first supply voltage $V_{CC}$ and the drain of transistor 248 is connected to node 249. Node 249 is connected to the gates of n-channel field effect transistors 260 and 261. The sources and substrates of transistors 260 and 261 are connected to first supply voltage $V_{CC}$. In one embodiment, $V_{CC}$ is approximately 3 volts. The drains of transistors 260 and 261 are connected to first leads 220a and 221a of MOS capacitors 220 and 221, respectively. Capacitors 220 and 221 are formed by connecting in common the source and drain of an MOS device to form one plate of the capacitor, with the gate forming the other place of the capacitor. In other embodiments, capacitors 220 and 221 are formed using other conventional techniques.

Within switching control circuit 201, the output signal of NAND gate 202 is also provided to the input terminal of a delay circuit formed by the series connection of inverters 241, 242, 243 and 244. The output terminal of inverter 244 is connected to node 245. Node 245 is also connected to both the drain and source of n-channel transistor 246. The gate of transistor 246 is connected to node 249, thereby forming an MOS capacitor from transistor 246.

The output signal of NAND gate 202 is also provided to the input terminal of amplifying inverter 204 within switching control circuit 201. The output signal of inverter 204 is provided to the gates of p-channel transistors 206 and 207 and to the gates of n-channel transistors 208 and 209. The source of transistor 206 is connected to $V_{CC}$ and the source of p-channel transistor 210. The drain of transistor 206 is connected to node 290 and the source of transistor 207. The drain of transistor 207 is connected to node 291 and the source of transistor 208. The drain of transistor 208 is connected to ground. The source and drain of transistor 209 are connected to nodes 290 and 291, respectively. Node 290 is connected to the gates of p-channel transistors 210 and 213. Node 291 is connected to the gates of n-channel transistors 211 and 216. The drain of transistor 210 is connected to the source of transistor 211 and the second lead 220b of MOS capacitor 220. The drain of transistor 211 is connected to ground. The source of transistor 213 is connected to the first lead 220a of MOS capacitor 220. The drain of transistor 213 is connected to the second lead 221b of MOS capacitor 221. The source of transistor 216 is connected to the second lead 221b of MOS capacitor 221 and the drain of transistor 216 is connected to ground. The first lead 221a of MOS capacitor 221 is connected to the gate, drain and substrate of n-channel transistor 230, thereby forming a diode between first lead 221a and output terminal 280. In an alternate embodiment, a conventional diode is used in place of transistor 230.

The EN signal is also provided to the input terminal of inverting amplifier 271. The output terminal of inverter 271 is connected to the gate of n-channel disabling transistor 270. The source of transistor 270 is connected to $V_{CC}$ and the drain of transistor 270 is connected to output terminal 280.

In one embodiment, transistors 248, 260, 261, and 270 are zero threshold CMOS devices. MOS Capacitors 220 and 221 are fabricated with a thin gate oxide (approximately 150 Angstroms), resulting in a higher capacitance. In an alternate embodiments, MOS capacitors 220 and 221 can be replaced with capacitors fabricated by locating a dielectric layer between plates formed in the poly 1 and poly 2 layers. Although the devices in FIG. 2 are illustrated in connection with a triple well process, it is understood that other processes can be used to fabricate the illustrated devices.

Charge stacking voltage generator 200 operates as follows. Voltage generator 200 receives two inputs through NAND gate 202. These signals include an input (IN) clock and an enabling (EN) signal. The enable signal is also provided through inverter 271 to a gate of disabling transistor 270. When the EN signal is low, the output signal of inverter 271 is high, thereby turning on transistor 270 and providing a voltage at output terminal 280. Because transistor 270 is a zero threshold CMOS transistor, the voltage at output terminal 280 is approximately $V_{CC}$. This effectively disables voltage generator 200.

To enable voltage generator 200, the EN signal is brought to a high state, thereby turning off transistor 270. Under these conditions, the IN signal controls the operation of voltage generator 200. The frequency of IN signal is typically 10 to 20 MHz, though other frequencies are possible.

Figure 3:
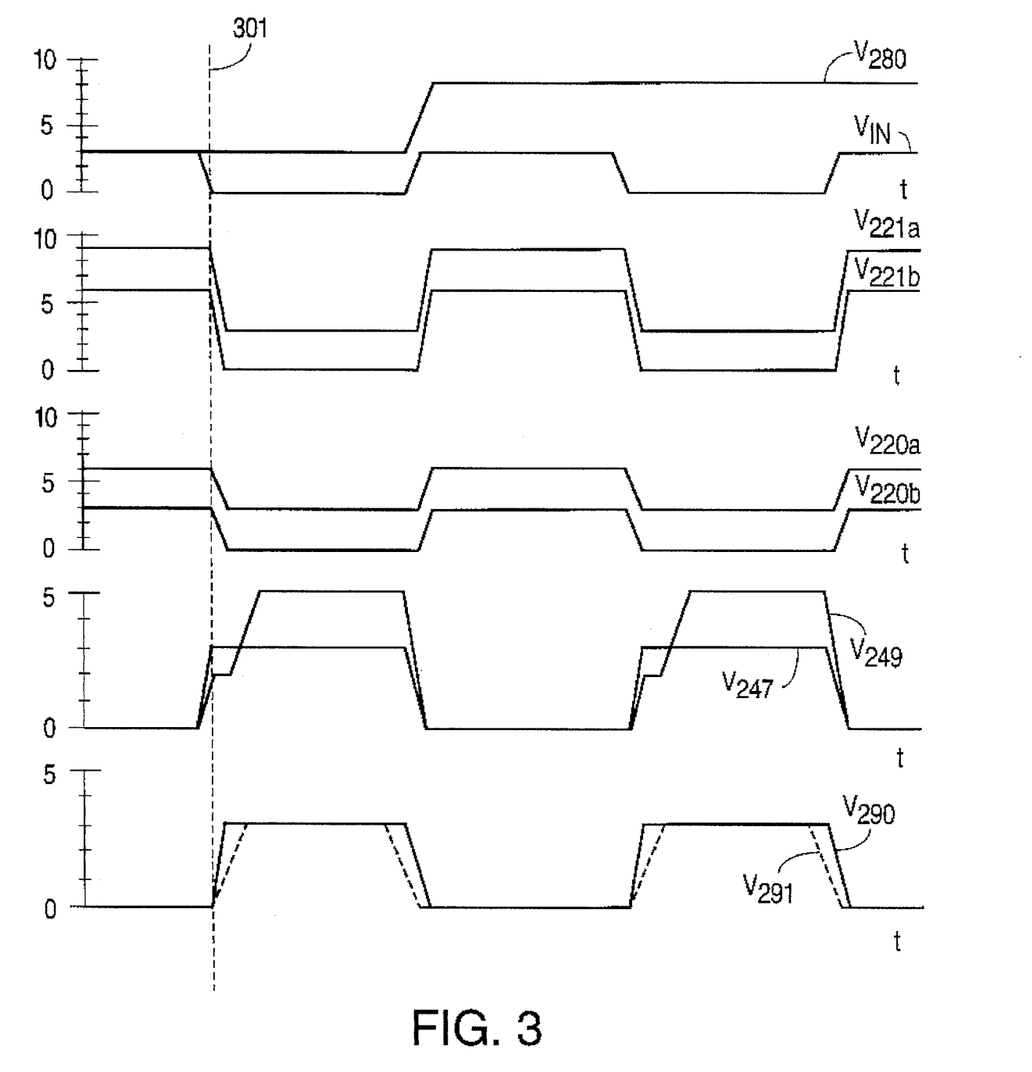
FIG. 3 is a waveform diagram illustrating voltages and currents at various nodes of the voltage generator of FIG. 2.

FIG. 3 is a waveform diagram illustrating voltages and currents at various positions in voltage generator 200. The voltages and currents illustrated in FIG. 3 are labelled with a subscript which identifies the location of the voltage or current in voltage generator 200. For example, $V_{IN}$ is the voltage of the IN signal and $V_{221a}$ is the voltage at lead 221a.

The EN signal is asserted high at the time illustrated by dashed line 301. During the first half cycle after the EN signal is asserted, the IN signal ($V_{IN}$) is at a logic low state. The low $V_{IN}$ signal causes the voltage at node 247 ($V_{247}$) to transition to a logic high state (i.e., $V_{CC}$ or 3 volts). $V_{247}$ is applied to the source and substrate of transistor 248. Under these conditions, current flows from the substrate of transistor 248 to the drain of transistor 248. The voltage drop across transistor 248 is equal to the threshold voltage of transistor 248, or approximately 1 volt. Consequently, $V_{249}$ is approximately 2 volts (i.e., $V_{CC}-1$ volt).

$V_{247}$ is also applied to node 245 through the delay circuit formed by inverters 241–244. Because of the short delay inherent in inverters 241–244, the voltage at node 245 does not immediately change from its initial value of 0 volts. As a result, 2 volts is initially applied across capacitor 246. As the voltage at node 245 increases, $V_{249}$ also increases, thereby reverse biasing the junction between the substrate and drain of transistor 248. As a result, transistor 248 is turned off, and no current flows from node 249 of capacitor 246 to node 247 through transistor 248. Because no current flows through capacitor 246, the charge on capacitor 246 must remain constant. Therefore, the voltage across capacitor 246 must also remain constant at 2 volts (because the voltage across capacitor 246 is equal to the charge stored by capacitor 246 divided by the capacitance of capacitor 246). Thus, when the voltage at node 245 increases to 3 volts, $V_{249}$ increases to approximately 5 volts. In this manner, MOS capacitor 246 charges such that $V_{249}$ exceeds $V_{CC}$. The delay characteristics of inverters 241–244, MOS capacitor 246 and transistor 248 are selected such that full charging of MOS capacitor 246 occurs during the first half cycle of the IN signal.

The voltage at node 249 is applied to the gates of CMOS charging transistors 263 and 261, thereby turning on these transistors and causing $V_{CC}$ to be applied to leads 220a and 221a of capacitors 220 and 221, respectively. Because the voltage at node 249 is greater than $V_{CC}$, the voltage transmitted through CMOS transistors 260 and 261 is approximately equal to $V_{CC}$. That is, the voltage drop across transistors 260 and 261 is negligible.

Also during the first half cycle of the IN signal, the logic high voltage at node 247 is applied to inverter 204. The resulting logic low voltage at the output terminal of inverter 204 turns on p-channel transistors 206 and 207 and turns off n-channel transistors 208 and 209. Consequently, a logic high voltage (i.e., $V_{CC}$ or 3 volts) exists on nodes 290 and 291. (See, FIG. 3, signals $V_{290}$ and $V_{291}$). The logic high voltage on node 290 causes p-channel MOS transistors 210 and 213 to turn off. The logic high voltage on node 291 causes n-channel MOS transistors 211 and 216 to turn on. As a result, the second lead 220b of capacitor 220 is connected through transistor 211 to ground. Similarly, the second lead 221b of capacitor 221 is connected through transistor 216 to ground. Because transistor 213 is turned off, leads 220a and 221b are not electrically coupled to one another. Thus, during the first half cycle of IN signal, capacitors 220 and 221 are connected in parallel between $V_{CC}$ and ground. Specifically, lead 220a of capacitor 220 is connected to $V_{CC}$ through transistor 260 and lead 220b of capacitor 220 is connected to ground through transistor 211, and lead 221a of capacitor 221 is connected to $V_{CC}$ through transistor 261 and lead 221b of capacitor 221 is connected to ground through transistor 216. (See, FIG. 3, signals $V_{220a}$, $V_{220b}$, $V_{221a}$, and $V_{221b}$). In this configuration, MOS capacitors 220 and 221 each charge to a voltage of $V_{CC}$. The characteristics of transistors 211, 216, 260 and 261 and capacitors 220–221 are selected such that capacitors 220–221 fully charge during the first half cycle of the IN signal.

The diode formed by transistor 230 prevents charge from leaking from output terminal 280 to node 221a during the first half cycle.

During the second half cycle of the IN signal, the IN signal transitions to a logic high voltage, resulting in a logic low voltage (i.e., 0 volts) at node 247. This logic low voltage is applied to the source and substrate of transistor 248. The logic low voltage applied to the substrate of transistor 248 turns on transistor 248. As a result, the voltage on node 249 is pulled down to a zero voltage. Consequently, transistors 260 and 261 are turned off and capacitors 220 and 221 are effectively disconnected from $V_{CC}$. Transistor 248 thereby promotes fast turn off of transistors 260 and 261.

The logical low output signal of NAND gate 202 is also transmitted to inverter 204. The logic high output signal of inverter 204 turns off p-channel MOS transistors 206 and 207 and turns on n-channel MOS transistors 208 and 209. This results in a logic low signal at nodes 290 and 291. The logic low signal at node 290 turns on p-channel MOS transistors 210 and 213. The low voltage signal at node 291 turns off n-channel MOS transistors 211 and 216. As a result, the second lead 220b of MOS capacitor 220 is connected to $V_{CC}$ through transistor 210. In addition, first lead 220a of capacitor 220 is coupled to second lead 221b of capacitor 221 through transistor 213. Also, first lead 221a of capacitor 221 is coupled to output terminal 280 through the diode formed by transistor 230. As a result, capacitors 220 and 221 are connected in series and the voltage at output terminal 280 is equal to $V_{CC}$, plus the voltage across capacitor 220, plus the voltage across capacitor 221, minus the voltage drop across the diode formed by transistor 230 (i.e., three times $V_{CC}$ minus the voltage drop across transistor 230).

Because only one diode voltage drop is experienced when providing a voltage to output terminal 280, voltage generator 200 transmits voltage to output terminal 280 more efficiently than prior art charge pump 100. Even if additional capacitors are added to the circuitry of voltage generator 200 to increase the voltage at output terminal 280, only one diode voltage drop exists. Additionally, unlike prior art charge pump 100, each of capacitors 220–221 is only subjected to a maximum voltage of $V_{CC}$. Consequently, the prior art problem of high voltage stress across the gate oxide of the capacitors is eliminated. Furthermore, because capacitors 220–221 are fully charged during the first half cycle of the IN signal, there is virtually no delay associated with providing a full supply voltage to output terminal 280.

In one embodiment, voltage generator 200 has an efficiency of 60% when the IN signal has a frequency of 20 MHz.

In one embodiment, output terminal 280 is connected to an output capacitor 281 which charges to the desired output voltage during the time that voltage generator 200 is discharging to output terminal 280. This output capacitor then provides this voltage during the half cycle that capacitors 220 and 221 are recharging. In another embodiment, two voltage generators such as voltage generator 200 are coupled to output terminal 280, such that one of the voltage generators is discharging while the other voltage generator is charging, thereby providing a constant voltage output at output terminal 280.

Transistors 207 and 209 are useful to reduce losses in voltage generator 200. For example, when nodes 290 and 291 transition to a low state from a high state, node 290 is connected to ground through transistors 209 and 208. However, node 291 is connected to ground through transistor 208 only. Consequently, node 291 drops to zero slightly before node 290 (based on the delay inherent in transistor 209). (See, FIG. 3, signals $V_{290}$ and $V_{291}$). Thus, transistor 216 turns off slightly before transistor 213 turns on, thereby preventing transistor 213 and transistor 216 from being turned on at the same time. If transistor 213 and 216 were turned on at the same time, charge could be lost on capacitors 220 and 221 as they could discharge through transistor 216 to ground.

Similarly, when nodes 290 and 291 transition from a low state to a high state, node 290 is connected to $V_{CC}$ through transistor 206. However, node 291 is connected to $V_{CC}$ through transistors 206 and 207. Consequently, node 290 transitions to a high state slightly before node 291 transitions to a high state (based on the delay inherent in transistor 207). (See, FIG. 3, signals $V_{291}$ and $V_{290}$). Thus, transistor 213 turns off before transistor 216 is turned on. This prevents current from flowing between $V_{CC}$ and ground through transistor 260, transistor 213 and transistor 216.

The previously described operation of transistors 207 and 209 also prevents transistors 210 and 211 from being turned on simultaneously during transitions of the IN signal. Consequently, undesirable current flow between $V_{CC}$ and ground through transistors 210 and 211 is prevented. This results in a power savings in voltage generator 200.

In an alternate embodiment, transistors 207 and 209 are eliminated, and nodes 290 and 291 are connected directly together. However, in such an embodiment, it is possible that transistors 213 and 216 may be turned on at the same time during transitions of the IN signal. Such a configuration causes an undesirable loss of charge in capacitors 220 and 221.

Figure 4A:
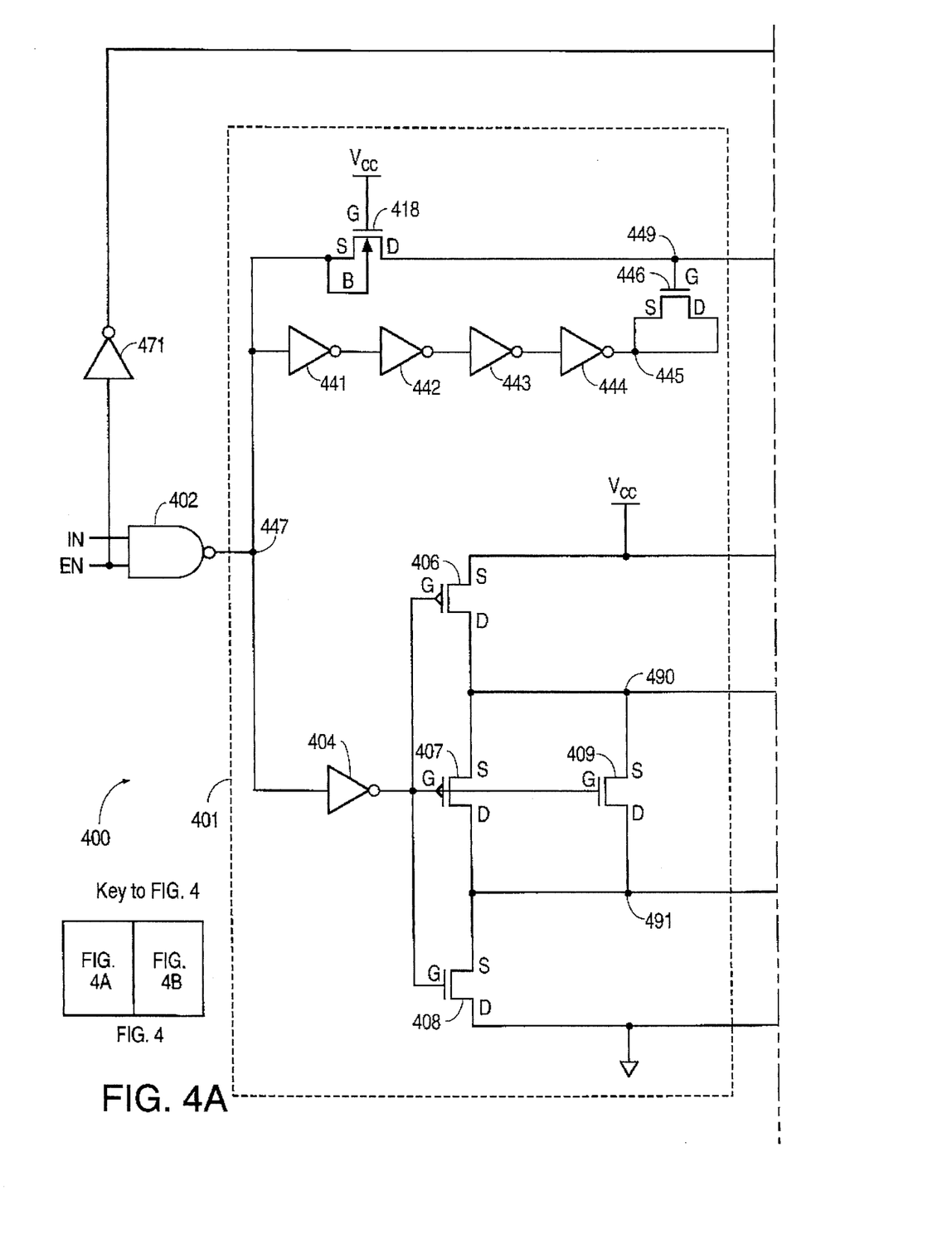
Figure 4B:
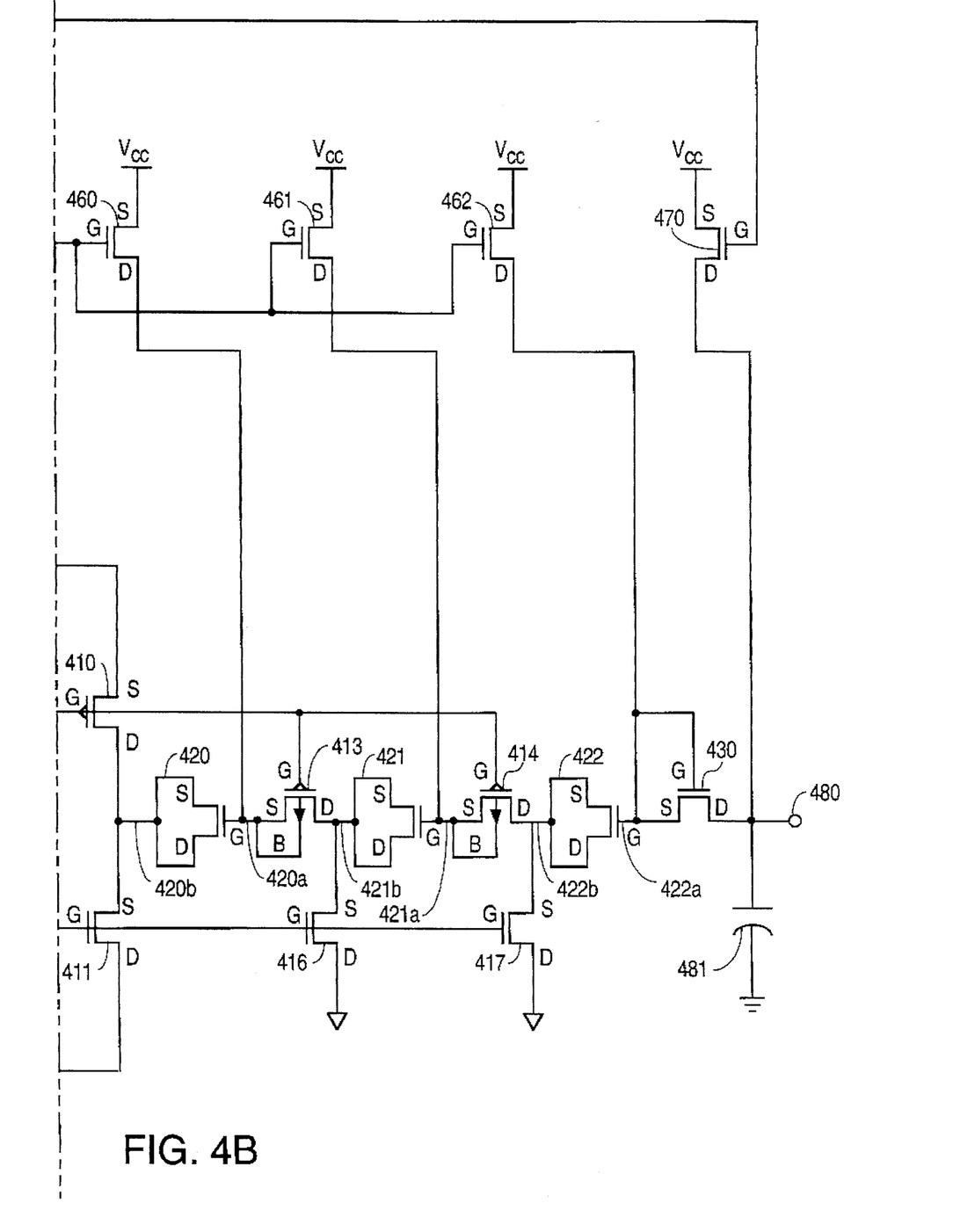

In other embodiments, additional capacitors (or only one capacitor) are utilized to generate the desired output voltage. FIG. 4 is a schematic diagram of an alternate embodiment of a stacked capacitor voltage generator 400 which utilizes three MOS capacitors 420, 421 and 422 to generate an output voltage. FIG. 4 consists of FIGS. 4A and 4B as illustrated. The embodiment illustrated in FIG. 4 is shown using elements fabricated using a conventional twin-well CMOS process. Stacked capacitor voltage generator 400 also includes NAND gate 402, inverters 404, 441–444 and 471, capacitor 446, and transistors 406–411, 413–414, 416–417, 428, 430, 460–462 and 470. The elements included in switching control circuit 401 and transistors 410 and 411 are appropriately sized to adequately drive the other elements of voltage generator 400.

Voltage generator 400 operates in a manner similar to voltage generator 200. During the first half cycle of the IN signal, MOS capacitors 420, 421 and 422 are connected in parallel between $V_{CC}$ and ground. Specifically, capacitor 420 is connected to $V_{CC}$ through transistor 460 and to ground through transistor 411, capacitor 421 is connected to $V_{CC}$ through transistor 461 and to ground through transistor 416; and capacitor 422 is connected to $V_{CC}$ through transistor 462 and to ground through transistor 417. In this manner, capacitors 420–422 are charged during the first half cycle of the IN signal.

During the second half cycle of the IN signal, charged capacitors 420–422 are connected in series between $V_{CC}$ and output terminal 480. Thus, second lead 420b of capacitor 420 is connected to $V_{CC}$ through transistor 410, first lead 420a of capacitor 420 is connected to second lead 421b of capacitor 421 through transistor 413, first lead 421a of capacitor 421 is connected to second lead 422b of capacitor 422 through transistor 414, and first lead 422a of capacitor 422 is connected to output terminal 480 through transistor 430. Output capacitor 481 is coupled to output terminal 480.

During the second half cycle of the IN signal, the voltage at output terminal 480 is approximately equal to $V_{CC}$, plus the sum of the voltages across capacitors 420–422, minus the voltage drop across the diode formed by transistor 430 (i.e., four times $V_{CC}$ minus the voltage drop across transistor 430). Only one diode voltage drop is experienced when providing a voltage to output terminal 480.

As more capacitors are utilized to provide an output voltage, certain circuit elements may require modification. For example, the sizes of the elements of switching control circuit 401 and transistors 410 and 411 may need to be increased in certain embodiments.

Although the present invention has been described in connection with several embodiments, it is understood that this invention is not limited to the embodiments disclosed, but is capable of various modifications which would be apparent to one of ordinary skill in the art. Thus, the present invention is limited only by the following claims.

I claim:

1. A charge stacking voltage generator comprising:

a first input terminal for receiving a first supply voltage;

a second input terminal for receiving a second supply voltage;

an output terminal;

a capacitor having a first terminal and a second terminal;

a first switch coupled between said first terminal of said capacitor and said first input terminal, said first switch having a control terminal;

a second switch coupled between said second terminal of said capacitor and said second input terminal, said second switch having a control terminal;

a third switch coupled between said second terminal of said capacitor and said first input terminal, said third switch having a control terminal;

a fourth switch coupled between said first terminal of said capacitor to said output terminal, said fourth switch having a control terminal; and a switching control circuit coupled to the control terminals of said first, second, third and fourth switches, wherein said switching control circuit provides control signals to the control terminals of the first, second, third and fourth switches, wherein said control signals cause said first and second switches to close and said third and fourth switches to open during a first time period, whereby the first and second supply voltages are applied to the capacitor during the first time period, and wherein said control signals cause said first and second switches to open and said third and fourth switches to close during a second time period.

2. The voltage generator of claim 1, wherein said first terminal of said capacitor is coupled to said output terminal through a diode.

3. The voltage generator of claim 1, wherein said switching control circuit comprises:

a third input terminal for receiving a clock signal;

a fifth switch coupled between said first input terminal and the control terminal of said third switch, said fifth switch having a control terminal coupled to said third input terminal; and a sixth switch coupled between the control terminal of said second switch and said second input terminal, said sixth switch having a control terminal coupled to said third input terminal.

4. The voltage generator of claim 3, wherein said switching control circuit further comprises:

a seventh switch coupled between the control terminal of said third switch and the control terminal of said second switch, said seventh switch having a control terminal coupled to said third input terminal; and an eighth switch coupled between the control terminal of said third switch and the control terminal of said second switch, said eighth switch having a control terminal coupled to said third input terminal.

5. The voltage generator of claim 1, wherein said switching control circuit comprises:

a third input terminal for receiving a clock signal;

a delay circuit having an input terminal and an output terminal, wherein the input terminal of said delay circuit is coupled to said third input terminal;

a second capacitor coupled between the output terminal of said delay circuit and the control terminal of said first switch; and a diode coupled between said third input terminal and the control terminal of said first switch.

6. The voltage generator of claim 1, further comprising:

a voltage generator enable terminal for receiving a generator enable signal;

a transistor having a gate coupled to said voltage generator enable terminal, a source coupled to said first input terminal and a drain coupled to said output terminal.

7. The voltage generator of claim 1, wherein said second supply voltage is ground.

8. The voltage generator of claim 1, wherein said switching control circuit is responsive to a clock signal and the first time period corresponds to a first half cycle of the clock signal and the second time period corresponds to a second half cycle of the clock signal.

9. The voltage generator of claim 8, wherein said clock signal has a frequency in the range of 10 to 20 megahertz.

10. The voltage generator of claim 1, wherein said voltage generator is fabricated on an integrated circuit chip.

11. A charge stacking voltage generator comprising:

a first input terminal for receiving a first supply voltage;

a second input terminal for receiving a second supply voltage;

an output terminal;

a plurality n of capacitors, each having a first terminal and a second terminal;

a plurality n of first switches, wherein each of said first switches is coupled between said first input terminal and a first terminal of an associated one of said capacitors, wherein said first switches, when closed, couple said first terminals of said capacitors to said first input terminal;

a plurality n of second switches, wherein each of said second switches is coupled between a second terminal of an associated one of said capacitors and said second input terminal, wherein said second switches, when closed, couple said second terminals of said capacitors to said second input terminal;

a plurality of third switches coupled to said capacitors, wherein said third switches, when closed, couple said capacitors in series between said first supply voltage and said output terminal; and a switching control circuit coupled to said first switches, said second switches and said third switches, wherein said switching control circuit controls the operation of said first switches, said second switches and said third switches.

12. A charge stacking voltage generator comprising:

a first input terminal for receiving a first supply voltage;

a second input terminal for receiving a second supply voltage;

a third input terminal for receiving a clock signal having a first state and a second state;

an output terminal;

a capacitor having a first terminal and a second terminal;

switching means coupled to said third input terminal and said capacitor, wherein said switching means couples said first terminal of said capacitor to said first input terminal and said second terminal of said capacitor to said second input terminal during said first state of said clock signal, and wherein said switching means couples said second terminal of said capacitor to said first input terminal and said first terminal of said capacitor to said output terminal during said second state of said clock signal.

13. The charge stacking voltage generator of claim 12, wherein said switching means comprises:

a first transistor having a first conductivity type, wherein said first transistor has a source coupled to said first input terminal, a drain coupled to said first terminal of said capacitor and a gate coupled to said third input terminal;

a second transistor having said first conductivity type, wherein said first transistor has a source coupled to said second terminal of said capacitor, a drain coupled to said second input terminal and a gate coupled to said third input terminal;

a third transistor having a second conductivity type opposite said first conductivity type, wherein said third transistor has a source coupled to said first input terminal, a drain coupled to said second terminal of said capacitor and a gate coupled to said third input terminal; and a fourth transistor having said second conductivity type, wherein said fourth transistor has a source coupled to said first terminal of said capacitor, a drain coupled to said output terminal and a gate coupled to said third input terminal.

14. A charge stacking voltage generator comprising:

a first input terminal for receiving a first supply voltage;

a second input terminal for receiving a second supply voltage;

an output terminal;

a plurality of capacitors;

charging means for coupling said capacitors in parallel between said first and second terminals, thereby charging said capacitors; and discharging means for coupling said charged capacitors in series between said first terminal and said output terminal, thereby discharging said capacitors to said output terminal; and control means for alternatively enabling and disabling the charging means and discharging means.

15. A switching control circuit for applying a control signal to a control terminal of a switch, said switching control circuit comprising:

a first input terminal for receiving a first supply voltage;

a second input terminal for receiving a clock signal;

a delay circuit having an input terminal coupled to said second input terminal, and having an output terminal;

a capacitor having a first terminal coupled to the output terminal of said delay circuit and a second terminal coupled to the control terminal of said switch; and a transistor having a gate coupled to said first input terminal, a source coupled to said second input terminal, a substrate coupled to said second input terminal and a drain coupled to the second terminal of said capacitor.

16. A method of generating a voltage on an integrated circuit chip, said method comprising the steps of:

providing a plurality of capacitors on the integrated circuit chip;

providing a clock signal;

charging the plurality of capacitors in parallel during a first half cycle of the clock signal; and discharging the plurality of capacitors in series during a second half cycle of the clock signal.

17. The method of claim 16, wherein said step of charging further comprises:

connecting each of said plurality of capacitors between a first supply voltage and a second supply voltage.

18. The method of claim 17, wherein said step of discharging further comprises:

connecting said plurality of capacitors in series between said first supply voltage and an output terminal.

19. The method of claim 18, further comprising the step of:

connecting a supply capacitor to said output terminal.

20. The method of claim 16, wherein each of the capacitors has a first terminal and a second terminal, further comprising the step of generating first, second and third control signals in response to the clock signal, wherein the charging step comprises the steps of:

turning on a first plurality of transistors in response to the first control signal, whereby the first plurality of transistors couple the first terminals of the capacitors to receive a first supply voltage;

turning on a second plurality of transistors in response to the second control signal, whereby the second plurality of transistors couple the second terminals of the capacitors to receive a second supply voltage; and turning off a third plurality of transistors in response to the third control signal, whereby the third plurality of transistors de-couple the first and second terminals of the capacitors;

and wherein the discharging step comprises the steps of:

turning off the first plurality of transistors in response to the first control signal, whereby the first plurality of transistors de-couple the first terminals of the capacitors from the first supply voltage;

turning off the second plurality of transistors in response to the second control signal, whereby the second plurality of transistors de-couple the second terminals of the capacitors from the second supply voltage; and turning on the third plurality of transistors in response to the third control signal, whereby the third plurality of transistors couple the capacitors in series between the first supply voltage and an output terminal.

* * * * *